United States Patent

[11] 3,593,071

[72] Inventor John L. Janning
Dayton, Ohio
[21] Appl. No. 813,633
[22] Filed Apr. 4, 1969
[45] Patented July 13, 1971
[73] Assignee The National Cash Register Company
Dayton, Ohio

[54] POINTED GATE SEMICONDUCTOR DEVICE

11 Claims, 7 Drawing Figs.

[52] U.S. Cl. .......... 317/235 R, 317/235 B, 317/234 N, 307/304, 325/430
[51] Int. Cl. .......... H01l 11/14
[50] Field of Search .......... 317/235, 235 R, 235 B; 307/304; 325/430

[56] References Cited

UNITED STATES PATENTS

| | | | |
|---|---|---|---|
| 3,333,168 | 7/1967 | Hofstein | 317/235 |
| 2,980,809 | 4/1961 | Teszner | 307/88.5 |
| 2,987,659 | 6/1961 | Tesner | 317/235 |

OTHER REFERENCES

Mochberg, I.B.M. TECHNICAL DISCLOSURE BULLETIN, Vol. 8, No. 5, Oct. 1965, page 813

*Primary Examiner*—John W. Huckert
*Assistant Examiner*—Martin H. Edlow
*Attorneys*—Louis A. Kline, John J. Callahan and John P. Tarlano

ABSTRACT: The present invention relates to a field effect semiconductor device which has a pointed source electrode pointing toward a pointed drain electrode. A pointed gate electrode is placed to each side of said pointed source and drain electrodes, in insulative contact with semiconductor material, which lies between the pointed source electrode and the pointed drain electrode. A control potential is applied between the pointed gate electrodes and the pointed source electrode, the control potential being thus concentrated within the semiconductor material. The field effect semiconductor device of the present invention has good transconductance.

INVENTOR
JOHN L. JANNING
BY Louis A. Kline
John J. Callahan
John P. Tarlano
HIS ATTORNEYS

INVENTOR
JOHN L. JANNING

BY

HIS ATTORNEYS

POINTED GATE SEMICONDUCTOR DEVICE

BACKGROUND OF THE INVENTION

In the prior art, a field effect semiconductor device is known which comprises a layer of semiconductor material separated by an insulator layer from a rectangular control electrode, called a gate electrode. Two rectangular electrodes, called source and drain electrodes, are connected to said semiconductor material. A control potential is applied between the rectangular gate electrode and the rectangular source electrode. Current is passed between the rectangular source and drain electrodes by means of a source-to-drain potential. An increase in the source-to-drain current is a function of an increase in the control potential applied to the rectangular gate electrode. The amount of increase in the source-to-drain current, for a given amount of increase in the control potential, is a measure of the transconductance of a field effect semiconductor device.

The field effect semiconductor device of the present invention has pointed source and drain electrodes instead of rectangular source and drain electrodes. A control potential is better concentrated, within the semiconductor material which lies between a rectangular gate electrode and a pointed source electrode, to give a field effect semiconductor device a large transconductance.

The field effect semiconductor device may also incorporate a pointed electrode to each side of said pointed source and drain electrodes, in place of a rectangular gate electrode. A concentration of said control potential also occurs between said pointed gate electrodes and said pointed source electrode. The transconductance of the field effect semiconductor device is large, since a control potential is concentrated by and between the pointed gate electrodes and the pointed source electrode. The control potential, which is applied to the pointed gate electrodes with respect to the pointed source electrode, has a large effect on the conductivity of the semiconductor material between the pointed source electrode and the pointed gate electrodes, to produce an improved electrical conductance between the pointed source electrode and the pointed drain electrode.

SUMMARY OF THE INVENTION

The present invention relates to a field effect semiconductor device comprising semiconductor material, a pointed source electrode pointing toward a pointed drain electrode substantially across said semiconductor material, an insulator layer upon said semiconductor material, and a gate electrode means upon said insulator layer for applying a control potential across said semiconductor material.

DESCRIPTION OF THE PREFERRED EMBODIMENT

Figure 1:
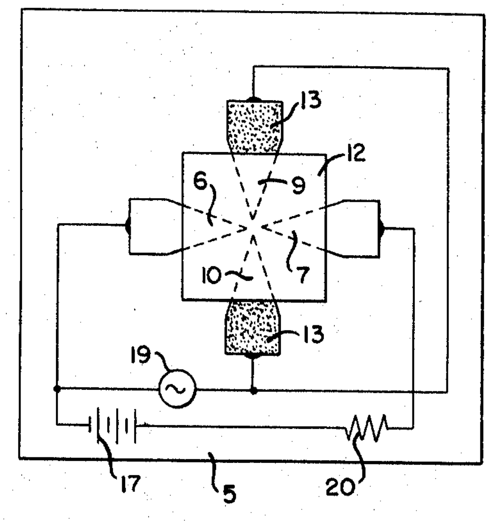
FIG. 1 is a plane view of a coplanar-type field effect semiconductor device which has two pointed gate electrodes, a pointed source electrode, and a pointed drain electrode on a substrate.

FIG. 1 shows a coplanar-type field effect semiconductor device of the present invention. On an insulative substrate 5, such as a glass substrate, are deposited gold-plated tantalum pointed source and drain electrodes 6 and 7, and tantalum pointed gate electrodes 9 and 10. Said four pointed electrodes form the source and drain electrodes and gate electrodes of a first embodiment of the field effect semiconductor device of the present invention. The tantalum pointed gate electrodes 9 and 10 are anodized to form tantalum oxide insulator layers 13 on said tantalum pointed gate electrodes 9 and 10. Semiconductor material 12, such as cadmium selenide semiconductor material, is evaporated upon the pointed source and drain electrodes 6 and 7, and upon the tantalum oxide insulator layers 13. The semiconductor material 12 is in electrical contact between the gold pointed source and drain electrodes 6 and 7, but in insulative contact with said pointed gate electrodes 9 and 10.

The field effect semiconductor device is used in the circuit shown in FIG. 1. A DC source-drain voltage means 17 and a load resistance 20 are connected in series circuit between the pointed source electrode 6 and the pointed drain electrode 7. A gate voltage means 19 is connected between said pointed gate electrodes 9 and 10 and said pointed source electrode 6. A field effect semiconductor device circuit is thus formed. A positive control potential from the gate voltage means 19 is produced in the semiconductor material 12 between the pointed gate electrodes 9 and 10 and the pointed source electrode 6. A highly conductive pathway is thus produced between the pointed source electrode 6 and the pointed drain electrode 7. A DC current, having amplitude varying with the gate voltage means 19, flows between the pointed source electrode 6 and the pointed drain electrode 7 when a positive voltage exists on the pointed gate electrodes 9 and 10 with respect to the pointed source electrode 6.

Figure 2:
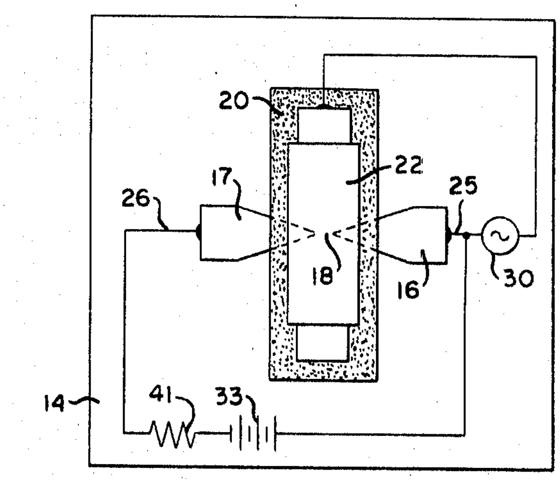
FIG. 2 is a plane view of a MOS-type field effect semiconductor device having two pointed P-type regions.

FIG. 2 shows a metal-oxide-semiconductor-type field effect semiconductor device of the present invention. In an N-type semiconductor material 14, such as in an N-type silicon semiconductor crystal, pointed P-type source and drain electrodes 16 and 17 are epitaxially formed, as by doping an N-type silicon semiconductor crystal with boron. The distance between said pointed P-type regions is approximately 3 microns. Across and between the points of said pointed P-type source and drain electrodes 16 and 17 is vacuum-deposited an insulator layer 20, such as a silicon monoxide insulator layer. Upon the silicon monoxide insulator 20 is vacuum-deposited an aluminum rectangular gate electrode 22. A source electrode lead wire 25 is placed in contact with the pointed P-type source electrode 16, and a drain electrode lead wire 26 is placed in contact with the pointed P-type drain electrode 17.

The field effect semiconductor device circuit of FIG. 2 is formed by connecting a voltage means 30 between the rectangular gate electrode 22 and said pointed P-type source electrode 16. A DC source-drain voltage means 33 and a load resistor 41 are connected in series circuit between the source electrode lead wire 25 and the drain electrode lead wire 26. A concentrated control potential, from the gate voltage means 30, is produced in the portion 18 of said N-type material 14, intermediately between said pointed P-type source and drain electrodes 16 and 17. This portion 18 of N-type material is made P-type when a negative voltage exists on the rectangular gate electrode 22 with respect to the pointed P-type source electrode 16. A DC current flows between the pointed P-type source electrode 16 and the pointed P-type drain electrode when the portion of the N-type semiconductor material 18 is made P-type, under the influence of the gate voltage means 30.

Figure 3:
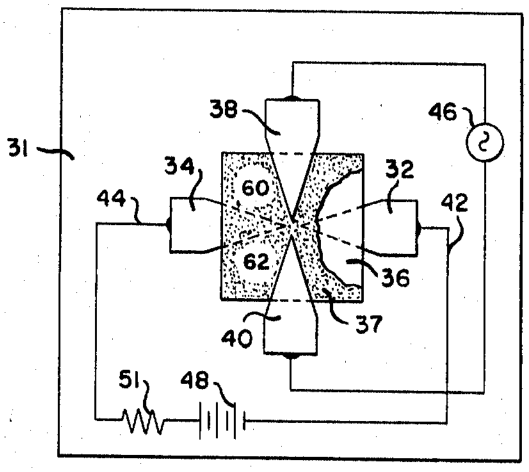
FIG. 3 is a plane view of a thin-film-type field effect semiconductor device which has two pointed gate electrodes above pointed source and drain electrodes.

FIG. 3 shows a thin-film-type field effect semiconductor device of the present invention. Upon an insulative substrate 31, such as a glass substrate, gold-plated chromium pointed source and drain electrodes 32 and 34 are vacuum-deposited.

The distance between the tips of said pointed source and drain electrodes is approximately 3 microns. In electrical contact with said pointed source and drain electrodes 32 and 34 is vacuum-deposited a semiconductor material 36, such as cadmium selenide semiconductor material. A silicon monoxide insulator layer 37 is vacuum-deposited upon the semiconductor material 36. Two pointed gate electrodes 38 and 40, such as two aluminum pointed gate electrodes, are vacuum-deposited upon the insulator layer 37. A source electrode lead wire 42 is connected to the pointed source electrode 32, and a drain electrode lead wire 44 is connected to the pointed drain electrode 34, by means of silver conductive paint.

The field effect semiconductor device of FIG. 3 may be used in the circuit of FIG. 3. A gate voltage means 46 is connected between the pointed gate electrode 38 and the pointed gate electrode 40. A DC source-drain voltage means 48 and a load resistor 51 are connected between the pointed source electrode 32 and the pointed drain electrode 34. Due to the pointing of the gate electrodes 38 and 40, a control potential from the gate voltage means 46 is highly concentrated across the semiconductor material 36 between said pointed gate electrodes 38 and 40. The gate voltage means 46, which is AC gate voltage means, either places a positive potential on the pointed gate electrode 38 with respect to the pointed gate electrode 40, or places a positive potential on the pointed gate electrode 40 with respect to the pointed gate electrode 38. If the pointed gate electrode 38 is at a positive potential with respect to the pointed gate electrode 40, a region 60 of said cadmium selenide semiconductor material 36, which is adjacent to said pointed gate electrode 38, is made conductive. Current then flows between the pointed source electrode 32 and the pointed drain electrode 24 through said region 60. If the pointed gate electrode 40 is at a positive potential with respect to the pointed gate electrode 38, the region 62 of the cadmium selenide semiconductor material 36, which is adjacent to said pointed gate electrode 40, is made conductive. Current then flows between the pointed source electrode 32 and the pointed drain electrode 34 through said region 62 of the cadmium selenide semiconductor material 36. Thus a DC current continuously flows between the pointed source electrode 32 and the pointed drain electrode 34. This DC current is the result of the application of the gate voltage means 46.

Figure 4:
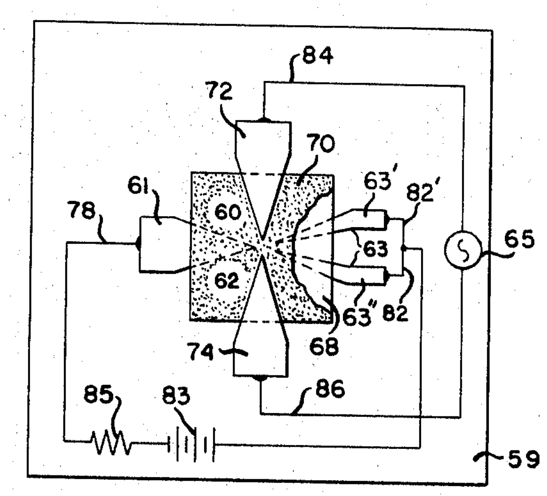
FIG. 4 is a plane view of a split pointed drain electrode type field effect semiconductor device which has two pointed gate electrodes above a pointed source electrode and a split pointed drain electrode.

FIG. 4 shows a split pointed drain electrode-type field effect semiconductor device having two pointed gate electrodes 72 and 74 above a pointed source electrode 61 and a split pointed drain electrode 63. Upon an insulative substrate 59, such as a glass substrate, a pointed source electrode 61, and a split pointed drain electrode 63, having halves 63′ and 63″, are chemically etched from a vacuum-deposited film. The separation between the halves 63′ and 63″ is approximately 1 micron. The separation between the pointed source electrode 61 and the split pointed drain electrode 63 is approximately 3 microns. On and between the split pointed drain electrode 63 and the pointed source electrode 61 is vacuum-deposited a semiconductor material 68, such as cadmium selenide semiconductor material. A silicon monoxide insulator layer 70 is vacuum-deposited upon the semiconductor material 68. Pointed gate electrodes 72 and 74 are vacuum-deposited upon the insulator layer 70. A source electrode lead wire 78 is connected to the pointed source electrode 61. Drain electrode lead wires 82′ and 82″ are connected to the split pointed drain electrode 63, using silver conductive paint. Gate electrode lead wires 84 and 86 are connected to the pointed gate electrodes 72 and 74, using silver conductive paint. A gate voltage means 65 is connected between the pointed gate electrodes 72 and 74. A DC source-drain voltage means 83 and a load resistor 85 are connected between the pointed source electrode 61 and the split pointed drain electrode 63.

Figure 5:
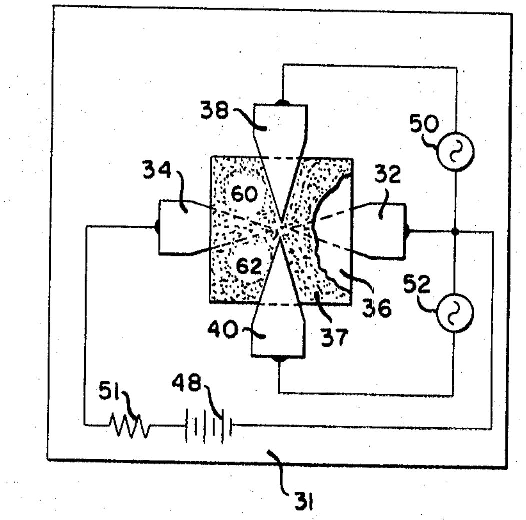
FIG. 5 is a plane view of a field effect semiconductor device mixer circuit.

A thin-film-type field effect semiconductor device may be used in a mixer circuit, as shown in FIG. 5. A gate voltage means 50, having a first radio frequency, is connected between the pointed gate electrode 38 and the pointed source electrode 32. A gate voltage means 52, having a slightly greater, second, radio frequency, is connected between the pointed gate electrode 40 and the pointed source electrode 32. The gate voltage means 50 modulates the conductivity of the semiconductor material layer 36 in the region 60, and the gate voltage means 52 modulates the conductivity of the semiconductor material layer 36 in the region 62. A varying DC current between the pointed source electrode 32 and the pointed drain electrode 34 results from the mixing of the gate voltage means 50 with the gate voltage means 52, within the semiconductor material 36. This varying DC current presents the difference frequency between the gate voltage means 50 and the gate voltage means 52 across the load resistor 51.

Figure 6:
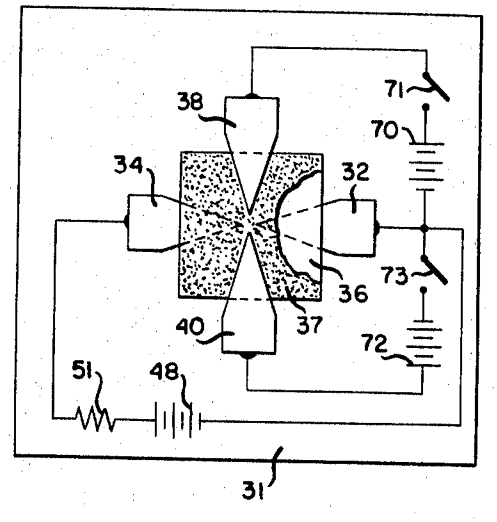
FIG. 6 is a plane view of a field effect semiconductor device "OR" logic circuit.

A thin-film-type field effect semiconductor device may be used in an "OR" type logic circuit, as shown in FIG. 6. If a first DC voltage means, 70, is placed in series circuit with the pointed gate electrode 38, with respect to the pointed source electrode 32, by means of a first switch 71, or if a second DC voltage means, 72, is placed in series circuit with the pointed gate electrode 40, with respect to the pointed source electrode 32, by means of a second switch 73, a source-drain current will flow between the pointed source electrode 32 and the pointed drain electrode 34. The "OR" logic circuit of FIG. 6 senses the closing of the switch 71, or senses the closing of the switch 73, or senses the closing of both switches 71 and 73.

Figure 7:
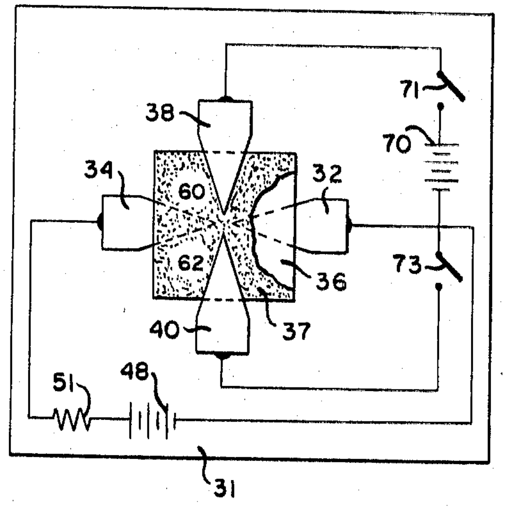
FIG. 7 is a plane view of a field effect semiconductor device "AND" logic circuit.

A thin-film-type field effect semiconductor device may be used in an "AND" logic circuit, as shown in FIG. 7. From the "OR" logic circuit of FIG. 6, the second DC voltage means 72 is eliminated, and no connection is made between the pointed source electrode 32 and the pointed gate electrodes 38 and 40. A source-drain current will flow if, and only if, both the switch 71 and the switch 73 are closed, in order to increase the conductivity of the semiconductor material 36, in the region 60.

What I claim is:

1. An insulated gate field effect semiconductor device, comprising:

a. a semiconductor body composed of semiconductor material of a first electrical conductivity;
b. two separate electrically conductive bodies composed of material having a second electrical conductivity different from said first electrical conductivity, said two bodies being located contiguous to said semiconductor body and each having a pointed end, with said pointed ends being adjacent to each other, said two bodies forming a pointed source electrode and a pointed drain electrode;
c. at least one flat electrically conductive body having a pointed end located in an intermediate position between said pointed source electrode and said pointed drain electrode, said flat electrically conductive body forming a pointed gate electrode means for applying a concentrated control potential across said semiconductor body in the region thereof between said pointed source and said pointed drain electrodes, the longitudinal axis of the pointed gate electrode being perpendicular to the longitudinal axis of the pointed source and drain electrodes; and
d. a body composed of electrically insulative material located intermediate said semiconductor body and said pointed gate electrode.

2. A coplanar-type insulated gate field effect semiconductor device, comprising:

a. a substrate of insulative material;
b. two separate electrically conductive flat metal bodies disposed upon said substrate of insulative material, each having a pointed end, with said pointed ends being adjacent to each other, said two bodies forming a pointed source electrode and a pointed drain electrode;
c. at least one flat electrically conductive metal body having a pointed and located in an intermediate position upon said substrate of insulative material between said pointed source electrode and said pointed drain electrode, said flat electrically conductive body forming a pointed gate electrode means for applying a concentrated control potential in the region between said pointed source and said pointed drain electrodes, the longitudinal axis of the pointed gate electrode being perpendicular to the longitudinal axis of said pointed source and drain electrodes;

d. a body of electrically insulative material disposed upon said pointed gate electrode; and e. a semiconductor body composed of semiconductor material disposed on said substrate of insulative material and in electrical contact with said pointed source and drain electrodes and on said body of electrically insulative material in insulative contact with said pointed gate electrode.

3. An MOS-type insulated gate field effect semiconductor device, comprising:

a. a semiconductor body composed of N-type semiconductor material;

b. two separate electrically conductive bodies composed of P-type semiconductor material, said two bodies located contiguous to said semiconductor body and each having a pointed end, with said pointed ends being adjacent to each other, said two bodies forming a pointed source electrode and a pointed drain electrode;

c. a body of electrically insulative material located on the semiconductor body intermediately between said pointed source and drain electrodes; and d. at least one flat electrically conductive metal body located upon said body of electrically insulative material in an intermediate position between said pointed source electrode and said pointed drain electrode, said flat electrically conductive body forming a pointed gate electrode means for applying a concentrated control potential across said semiconductor body in the region between said pointed source and said pointed drain electrodes, the longitudinal axis of the pointed gate electrode being perpendicular to the longitudinal axis of the pointed source and drain electrodes.

4. A thin film-type insulated gate field effect semiconductor device, comprising:

a. a substrate of insulative material;

b. two separate electrically conductive flat metal bodies disposed upon said substrate of insulative material, each having a pointed end, with said pointed ends being adjacent to each other, said two bodies forming a pointed source electrode and a pointed drain electrode;

c. a semiconductor body composed of semiconductor material disposed on said substrate and on said separate electrically conductive flat metal bodies;

d. a body composed of electrically insulative material located upon said semiconductor body; and e. at least one flat electrically conductive body having a pointed end located in an intermediate position between said pointed source electrode and said pointed drain electrode upon said body composed of electrically insulative material, said flat electrically conductive body forming a pointed gate electrode means for applying a concentrated control potential across said semiconductor body in the region between said pointed source and pointed drain electrodes, the longitudinal axis of the pointed gate electrode being perpendicular to the longitudinal axis of said pointed source and drain electrodes.

5. A thin film type insulated gate field effect semiconductor device circuit, comprising:

a. a substrate of insulative material;

b. two separate electrically conductive flat metal bodies disposed upon said substrate of insulative material, each having a pointed end, with said pointed ends being adjacent to each other, said two bodies forming a pointed source electrode and a pointed drain electrode;

c. a semiconductor body composed of semiconductor material disposed on said substrate and on said separate electrically conductive flat metal bodies;

d. a body composed of electrically insulative material located upon said semiconductor body; and e. at least one flat electrically conductive body having a pointed end located in an intermediate position between said pointed source electrode and said pointed drain electrode upon said body composed of electrically insulative material, said flat electrically conductive body forming a pointed gate electrode means for applying a concentrated control potential across said semiconductor body in the region between said pointed source and pointed drain electrodes, the longitudinal axis of the pointed gate electrode being perpendicular to the longitudinal axis of said pointed source and drain electrodes;

f. a gate voltage means connected between said pointed gate electrode means and said pointed source and drain electrodes for producing a concentrated control potential in the semiconductor material between said pointed source and drain electrodes; and g. a DC source-drain voltage means, and a load resistor connected in series circuit between said pointed source electrode and said pointed drain electrode for passing a current through said semiconductor material between said pointed source and drain electrodes.

6. A coplanar-type insulated gate field effect semiconductor device circuit, comprising:

a. a substrate of insulative material;

b. two separate electrically conductive flat metal bodies disposed upon said substrate of insulative material, each having a pointed end, with said pointed ends being adjacent to each other, said two bodies forming a pointed source electrode and a pointed drain electrode;

c. at least one flat electrically conductive metal body having a pointed end located in an intermediate position upon said substrate of insulative material between said pointed source electrode and said pointed drain electrode, said flat electrically conductive body forming a pointed gate electrode means for applying a concentrated control potential in the region between said pointed source and said pointed drain electrodes, the longitudinal axis of the pointed gate electrode being perpendicular to the longitudinal axis of said pointed source and drain electrodes;

d. a body of electrically insulative material disposed upon said pointed gate electrode;

e. a semiconductor body composed of semiconductor material disposed on said substrate of insulative material and in electrical contact with said pointed source and drain electrodes and on said body of electrically insulative material in insulative contact with said pointed gate electrode;

f. a gate voltage means connected between said pointed gate electrode means and said pointed source and drain electrodes for producing a concentrated control potential in the semiconductor material between said pointed source and drain electrodes; and g. a DC source-drain voltage means and load resistor connected in series circuit between said pointed source electrode and said pointed drain electrode for passing a current through the semiconductor material between said pointed source and drain electrodes.

7. A MOS-type insulated gate field effect semiconductor device circuit, comprising:

a. a semiconductor body composed of N-type semiconductor material;

b. two separate electrically conductive bodies composed of P-type semiconductor material, said two bodies located contiguous to said semiconductor body and each having a pointed end, with said pointed ends being adjacent to each other, said two bodies forming a pointed source electrode and a pointed drain electrode;

c. a body of electrically insulative material located on the semiconductor body intermediately between said pointed source and drain electrodes;

d. at least one flat electrically conductive metal body located upon said body of electrically insulative material in an intermediate position between said pointed source electrode and said pointed drain electrode, said flat electrically conductive body forming a pointed gate electrode means for applying a concentrated control potential across said semiconductor body in the region between said pointed source and said pointed drain electrodes, the longitudinal axis of the pointed gate electrode being perpendicular to the longitudinal axis of the pointed source and drain electrodes;

e. a gate voltage means connected between said pointed gate electrode means and said pointed source and drain electrode, for producing a concentrated control potential in the portion of said semiconductor material intermediately between said pointed source electrode and said pointed drain electrode; and f. a DC source-drain voltage means and a load resistor connected in series circuit between said pointed source electrode and said pointed drain electrode, for passing a DC current through the semiconductor material between said pointed source and drain electrodes.

8. A thin film-type insulated gate field effect semiconductor device mixer circuit, comprising:

a. a substrate of insulative material;

b. two separate electrically conductive flat metal bodies disposed upon said substrate of insulative material, each having a pointed end, with said pointed ends being adjacent to each other, said two bodies forming a pointed source electrode and a pointed drain electrode;

c. a semiconductor body composed of semiconductor material disposed on said substrate and on said separate electrically conductive flat metal bodies;

d. a body composed of electrically insulative material located upon said semiconductor body;

e. two flat electrically conductive bodies each having a pointed end located in an intermediate position between said pointed source electrode and said pointed drain electrode upon said body composed of electrically insulative material, said flat electrically conductive bodies forming two pointed gate electrodes opposite each other for applying a concentrated control potential across said semiconductor body in the region between said pointed source and pointed drain electrodes, the longitudinal axis of the pointed gate electrode being perpendicular to the longitudinal axis of said pointed source and drain electrodes;

f. a first AC gate voltage means, having a first frequency, connected between a first pointed gate electrode and said pointed source electrode and a second AC gate voltage means, having a second frequency, connected between a second pointed gate electrode and said pointed source electrode; and g. a DC source-drain voltage means connected between said pointed source electrode and said pointed drain electrode for passing a varying current through said semiconductor material between said pointed source and drain electrodes, which variation is in response to the difference in the frequency between the first and second gate voltage means.

9. A thin film-type insulated gate field effect semiconductor device "OR" logic circuit, comprising:

a. a substrate of insulative material;

b. two separate electrically conductive flat metal bodies disposed upon said substrate of insulative material, each having a pointed end, with said pointed ends being adjacent to each other, said two bodies forming a pointed source electrode and a pointed drain electrode;

c. a semiconductor body composed of semiconductor material disposed on said substrate and on said separate electrically conductive flat metal bodies;

d. a body composed of electrically insulative material located upon said semiconductor body;

e. two flat electrically conductive bodies having a pointed end located opposite each other in an intermediate position between said pointed source electrode and said pointed drain electrode upon said body composed of electrically insulative material, said flat electrically conductive bodies forming two pointed gate electrodes for applying a concentrated control potential across said semiconductor body in the region between said pointed source and pointed drain electrodes, the longitudinal axis of the pointed gate electrode being perpendicular to the longitudinal axis of said pointed source and drain electrodes;

f. a first DC gate voltage means and first switch connected between a first pointed gate electrode and said pointed source electrode, and a second DC gate voltage means and second switch connected between a second pointed gate electrode and said pointed source electrode; and g. a DC source-drain voltage means connected between said pointed source electrode and said pointed drain electrode for passing a current through the semiconductor material between said pointed source and drain electrodes, when either said first switch for said second switch is closed.

10. A thin film-type insulated gate field effect semiconductor device "AND" logic circuit, comprising:

a. a substrate of insulative material;

b. two separate electrically conductive flat metal bodies disposed upon said substrate of insulative material, each having a pointed end, with said pointed ends being adjacent to each other, said two bodies forming a pointed source electrode and a pointed drain electrode;

c. a semiconductor body composed of semiconductor material disposed on said substrate and on said separate electrically flat metal bodies;

d. a body composed of electrically insulative material located upon said semiconductor body;

e. two flat electrically conductive bodies having a pointed end located in an intermediate position between said pointed source electrode and said pointed drain electrode upon said body composed of electrically insulative material, said flat electrically conductive bodies forming two pointed gate electrodes that are opposite each other for applying a concentrated control potential across said semiconductor body in the region between said pointed source and pointed drain electrodes, the longitudinal axis of the pointed gate electrode being perpendicular to the longitudinal axis of said pointed source and drain electrodes;

f. a DC gate voltage means, a first switch and a second switch connected in series between a first pointed gate electrode and a second pointed gate electrode; and g. a DC voltage means connected between said pointed source electrode and said pointed drain electrode for passing a current through the semiconductor material between said pointed sourceand drain electrodes, when both said first switch and said second switch are closed.

11. A split pointed drain electrode-type insulated gate field effect semiconductor device, comprising:

a. a substrate of insulative material;

b. three separate electrically conductive flat metal bodies disposed upon said substrate of insulative material, each having a pointed end, with two of said pointed ends being adjacent to the other, said three bodies forming a pointed source electrode and a split pointed drain electrode;

c. a semiconductor body composed of semiconductor material disposed on said substrate and on said separate electrically conductive flat metal bodies;

d. a body composed of electrically insulative material located upon said semiconductor body; and e. at least one flat electrically conductive body having a pointed end located in an intermediate position between said pointed source electrode and said pointed drain electrode upon said body composed of electrically insulative material, said flat electrically conductive body forming pointed gate electrode means for applying a concentrated control potential across said semiconductor body in the region between said pointed source electrode and said split pointed drain electrode, the longitudinal axis of the pointed gate electrode being perpendicular to the longitudinal axis of said pointed source electrode and said split pointed drain electrode.